United States Patent
Ida

(10) Patent No.: US 6,597,432 B2
(45) Date of Patent: Jul. 22, 2003

(54) BOARD-STAGE FOR AN ALIGNER

(75) Inventor: Ryoichi Ida, Tokyo (JP)

(73) Assignee: Adtec Engineering Co., Ltd., Tokyo (JP)

( * ) Notice: Subject to any disclaimer, the term of this patent is extended or adjusted under 35 U.S.C. 154(b) by 0 days.

(21) Appl. No.: 10/137,574

(22) Filed: May 2, 2002

(65) Prior Publication Data

US 2002/0176064 A1 Nov. 28, 2002

(30) Foreign Application Priority Data

May 24, 2001  (JP) ........................ 2001-155131

(51) Int. Cl.⁷ .................. G03B 27/60; G03B 27/42; G03B 27/20; B25B 11/00
(52) U.S. Cl. .................. 355/73; 355/53; 355/91; 269/21
(58) Field of Search .................. 355/53, 73, 91, 355/94, 76; 269/21

(56) References Cited

U.S. PATENT DOCUMENTS

| | | | | |
|---|---|---|---|---|
| 4,522,489 A | * | 6/1985 | Bouwer ........................ 355/73 |
| 4,529,303 A | * | 7/1985 | Ternes ........................ 355/91 |
| 5,180,000 A | * | 1/1993 | Wagner et al. ............. 165/80.1 |
| 5,281,297 A | * | 1/1994 | Lee ............................. 156/552 |
| 5,417,408 A | * | 5/1995 | Ueda ........................... 269/21 |
| 5,471,279 A | * | 11/1995 | Takizawa ..................... 355/73 |
| 5,923,408 A | * | 7/1999 | Takabayashi ................ 355/53 |
| 6,164,633 A | * | 12/2000 | Mulligan et al. ............. 269/21 |
| 6,446,948 B1 | * | 9/2002 | Allen ........................... 65/247 |
| 2002/0117792 A1 | * | 8/2002 | Leidy et al. .................. 269/21 |

* cited by examiner

Primary Examiner—Alan A. Mathews
(74) Attorney, Agent, or Firm—Nields & Lemack

(57) ABSTRACT

A board stage of an aligner that can avoid bending of a printed circuit board to be exposed and accomplish high accurate exposure. In one preferred mode a suction plate 2 having small holes 20 is mounted on a supporting body on which a space 30 bigger than the small holes is provided. The holes 20 are connected to the space 30 and to a vacuum device via an air passage 31 and a bottom passage 32. The diameter of the suction hole 20 is so less than 0.4 mm not to make at the printed circuit board such bending that causes exposure troubles.

6 Claims, 3 Drawing Sheets

BOARD-STAGE FOR AN ALIGNER

BACKGROUND OF THE INVENTION AND RELATED ART STATEMENT

1. Field of the Invention

The invention relates to a board-stage for an aligner, on which an object to be exposed is placed to be aligned and exposed.

2. Related Art

Printed circuit boards become thin as electric equipments become smaller and thinner. For example, a flexible circuit board has been developed and is becoming a common device since it is flexible and plastic to conform to the figure of casing of the electric equipments. These thin type of printed circuit boards have typically about 50 μm thickness or less to about 25 μm.

These printed circuit boards are produced by photolithographic method, where aligners that is similar to the one used in semiconductor integrated circuits producing are utilized for exposing circuit patters on the boards. It is needed in using the aligners to hold the printed circuit boards on an exposing stage. Typically the stage has hole to vacuum the board laid thereon and to hold it.

OBJECT OF THE INVENTION

However the boards have been thinned as described above, there is a problem that the thin boards tend to be bent at the portion that touches the vacuum hole on the stage. Such bending of boards causes between a photo-mask and the board the gap that leads to many exposing troubles and to wrong resolution. The object of the invention is to resolve such problems.

SUMMARY OF THE INVENTION

The present invention is characterized by comprising a plurality of holes for absorbing the board having an aperture on the board stage and the suction means connected to the holes for absorbing the board, wherein said plurality of holes have such size that does not make the board bend, which causes exposing troubles when absorbing the board.

According to the inventor's studies, the diameter of the suction holes must be less than 0.4 mm in order to prevent such bend that causes exposing troubles for the board of 50 μm thickness that is average at thin type printed circuit boards. Such small holes can be produced easily and at low cost by photolithographic method.

When making small holes by photolithographic method, it is preferred to make holes on a metal plate and use it as a suction plate.

The metal suction plate on which the small holes are made is preferably supported by a supporting body having a suction space connected to the holes.

The suction space may be opened on the one face of the supporting body and the suction plate may be set on the face by gluing or the like.

The aperture of the suction space must be substantially small in order not to make on the metal plate such bending that causes exposing troubles when absorbing. However since the suction metal plate can be thicker than the printed circuit boards, for example it may be about 1 mm thickness, it is easy to form the aperture of the suction space at such size not to bend the suction plate.

Said supporting body may be provided with an air passage connected to the suction space and to the means for absorbing the board. The diameter of the air passage is preferably smaller than the suction space to keep the strength of the supporting body.

DETAILED DESCRIPTION OF THE PREFERRED EMBODIMENT

Figure 1:
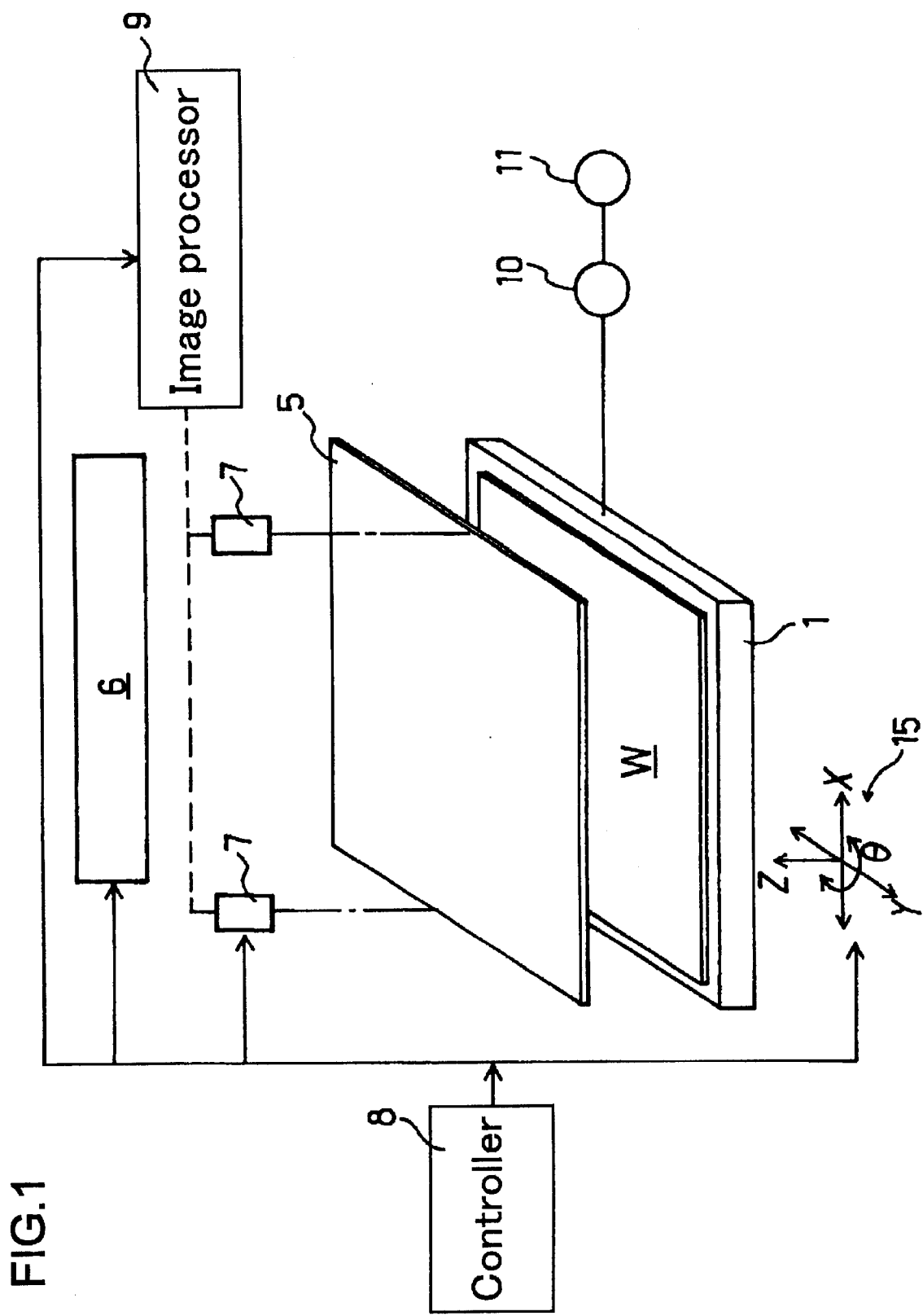
FIG. 1 shows a schematic perspective view of an embodiment of the invention.

The invention will now be described in reference to the attached drawings. FIG. 1 shows the outline of an aligner.

A board W to be printed with a circuit pattern is placed on a stage 1. The board W is held on the stage 1 by absorbing at suction holes 20 on a suction plate 2 shown in FIG. 2. 10 is a solenoid and 11 is a vacuum device.

The stage 1 is movable in a XYZ-axis direction and rotatable in a θ direction by a transfer device 15 equipped therewith.

A mask 5 is depicted with a circuit pattern to be printed on the board W. The mask 5 is aligned with the board W by moving the stage 1 by the transfer device 15 controlled by an image processor 9 receiving signals from a CCD camera 7. After the alignment, the mask 5 and the board W approach each other and contact or become closely adjacent. With such positions of the mask 5 and the board W, an exposing light source 6 issues exposing light and exposes the circuit pattern onto the board W.

Figure 2:
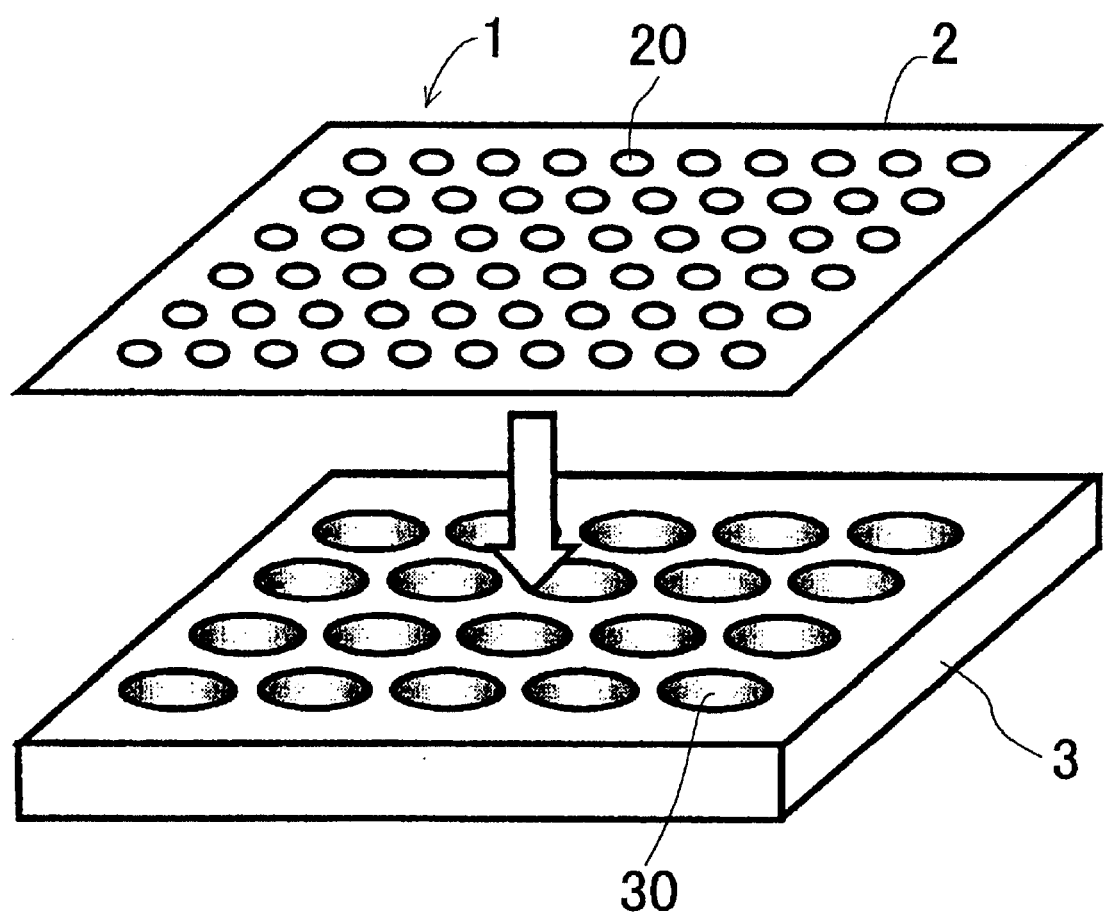
FIG. 2 shows a schematic exploded view of the part of the embodiment of the invention.

As shown in FIG. 2, the stage 1 comprises a plate for suction 2 and supporting body 3. The plate 2 is a thin metal plate, all over the surface of which suction holes 20 are formed. The suction holes 20 are preferably formed by photolithographic method, because the method can form precisely the holes 20 at low cost.

The diameter of the suction holes 20 is preferably less than 0.4 μm. The hole size of less than 0.4 μm for about 50 μm thickness of the board W does not cause at the board W such bending that causes exposing troubles.

The supporting body 3 has spaces 30. The aperture of the spaces 30 open at one side of the supporting body 3 on which a suction plate 2 is mounted.

The plate for suction 2 is secured on said side of the supporting body 3 by glue or the like.

Figure 3:
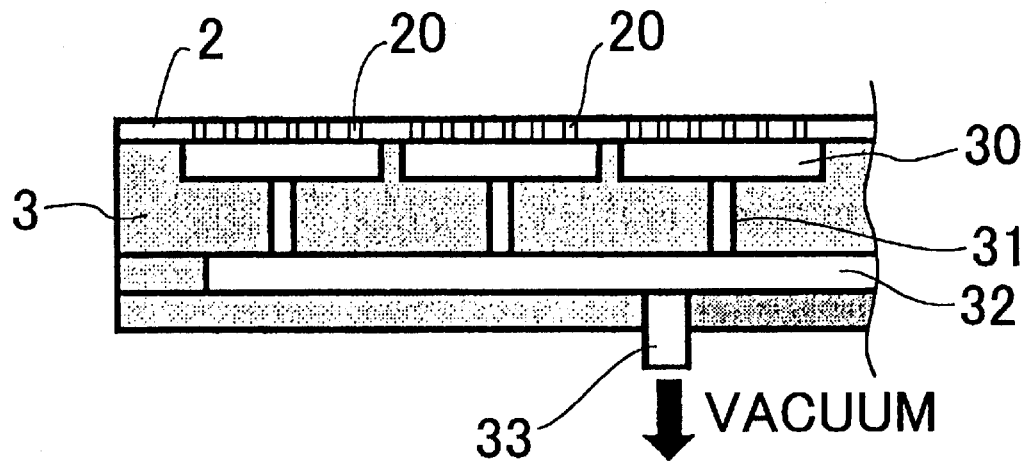
FIG. 3 shows a fragmentary sectional view of the embodiment of the invention.

As shown in FIG. 3, the spaces 30 do not pierced the supporting body 3 and connect to a bottom passage 32 via air passages 31 that have smaller diameter than the space 30. The bottom passage 32 connects to a connection passage 33 joined to the solenoid 10 and the vacuum device 11 shown in FIG. 1.

The supporting body 3 can be strengthened by making the diameter of the air passage 31 smaller than the space 30.

The diameters of the spaces 30 can be larger than the suction holes 20 as long as the size does not cause at the plate 2 such bending that causes exposing troubles. In the embodiment, the diameter of spaces 30 is 3 mm while the thickness of the suction plate 2 is 1 mm.

Figure 4:
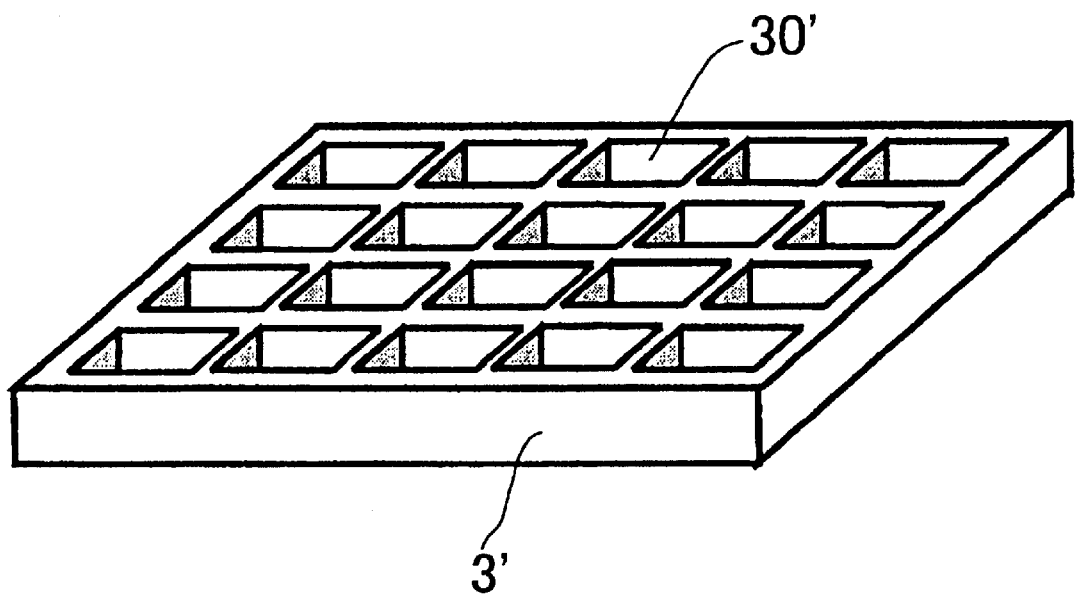
FIG. 4 shows a schematic perspective view of another embodiment of the invention.

FIG. 4 shows a supporting body 3' of another embodiment. The space 30 is not round but square. Any other shape can be employed as the space 30'.

In the constructions explained above, when the board W is placed on the plate for suction 2 and held thereon by absorbing by the vacuum device 11 through the solenoid 10, the board W will not be so bent that exposing troubles arises because the suction holes 20 are so small. Accordingly the at high precise exposure process can be done.

As explained above, the board-stage for an aligner of the invention does not make on the board to be exposed such bending that causes exposing troubles and can accomplish the high accurate exposing.

What is claimed is:

1. A board stage for an aligner for producing printed circuit boards, comprising;
   a suction plate having a plurality of holes for absorbing the board,
   a supporting body for supporting said suction plate and having a plurality of spaces for suction that are larger in diameter than said holes and are connected to said holes of said suction plate for absorbing the board;
   suction means connected to said holes for absorbing the board via the holes,
   wherein said holes have such size that does not make at the board such bending that causes exposing troubles when absorbing the board.

2. The board stage of claim 1, wherein the diameter of the holes is less than 0.4 mm.

3. The board stage of claim 1, wherein said space for suction is open at a face of said supporting body, said suction plate is mounted on the face of the supporting body.

4. The board stage of claim 1, wherein the size of said space for suction is so small as not to make at the suction plate such bending that cause exposing troubles.

5. The board stage of claim 1, wherein said supporting body has an air passage, the diameter of which is less than the diameter of the space for suction.

6. A board stage for an aligner for producing printed circuit boards, comprising;
   a suction plate having a plurality of holes for absorbing the board,
   a supporting body supporting said suction plate, said supporting body having a plurality of spaces for suction that are larger in diameter than said holes, said supporting body being disposed with respect to said suction plate such that each of said plurality of spaces is aligned and in fluid communication with a respective hole of said suction plate;
   suction means in fluid communication with said spaces and said holes for absorbing the board.

* * * * *